(12) United States Patent
Chiu et al.

(10) Patent No.: US 7,294,451 B2
(45) Date of Patent: Nov. 13, 2007

(54) RAISED SOLDER-MASK-DEFINED (SMD) SOLDER BALL PADS FOR A LAMINATE ELECTRONIC CIRCUIT BOARD

(75) Inventors: Tz-Cheng Chiu, Plano, TX (US); Manjula N. Variyam, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 501 days.

(21) Appl. No.: 10/715,641

(22) Filed: Nov. 18, 2003

(65) Prior Publication Data

US 2005/0106505 A1    May 19, 2005

(51) Int. Cl.
*H01I 23/48* (2006.01)
(52) U.S. Cl. .................... 430/311; 257/738; 257/780; 257/781
(58) Field of Classification Search .............. None
See application file for complete search history.

(56) References Cited

U.S. PATENT DOCUMENTS 6,762,503 B2 * 7/2004 Lee .......................... 257/781
2002/0173075 A1 * 11/2002 Tie et al. .................... 438/108

* cited by examiner

*Primary Examiner*—John A. McPherson
(74) *Attorney, Agent, or Firm*—Yingsheng Tung; Wade James Brady, III; Frederick J. Telecky, Jr.

(57) ABSTRACT

A raised solder-mask-defined (SMD) pad configured for receiving a solder ball on a laminate electronic circuit board and a method of creating the raised SMD pad on a laminate electronic circuit board. The method may comprise forming a base bump, covering the base bump with a conductive bump layer and layering a surrounding material over an extended edge of the conductive bump layer. The surrounding material is patterned to expose a pad face and of a portion of the sides of the conductive bump layer, such that the pad face is disposed above the surface of the surrounding material. The surrounding material may be patterned by a photolithography operation or alternatively, a laser-drill operation.

10 Claims, 7 Drawing Sheets

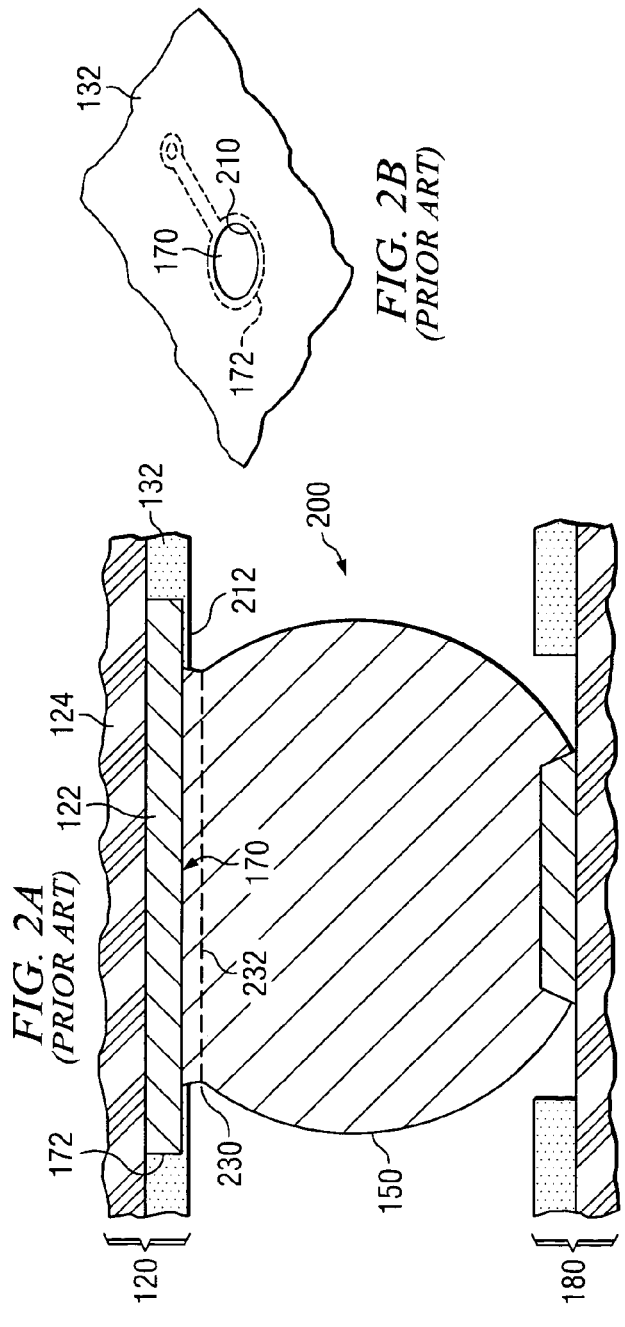
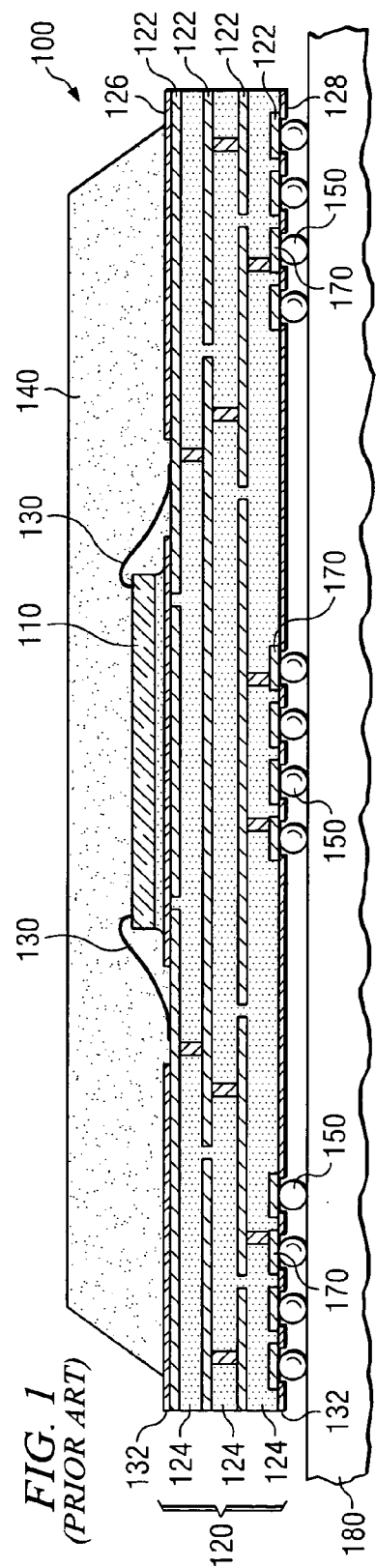
FIG. 2A (PRIOR ART)
FIG. 2B (PRIOR ART)
FIG. 1 (PRIOR ART)

US 7,294,451 B2

RAISED SOLDER-MASK-DEFINED (SMD) SOLDER BALL PADS FOR A LAMINATE ELECTRONIC CIRCUIT BOARD

BACKGROUND OF THE INVENTION

Integrated circuits are fabricated on the surface of a semiconductor wafer in layers and later singulated into individual dies. Since the material of a semiconductor wafer—commonly silicon—tends to be relatively fragile and brittle, dies are often assembled into a protective housing, or package, before they are interconnected with a printed circuit board (PCB). Referring now to FIG. 1, a cross-sectional view is shown of a packaged semiconductor device 100. A semiconductor die 110 is shown attached to a package substrate 120, a structure comprising alternating layers of conductive material 122 and insulating material 124. The die 110 is electrically interconnected to the package substrate 120 by a plurality of bond wires 130. The top surface 126 and bottom surface 128 of the package substrate 120 may be covered with a photo-definable solder mask material 132, in which openings can be created, exposing a portion of the metal 122 below.

The die 110 and bond wires 130 may be encapsulated by a solid mold compound 140 (e.g., an epoxy), protecting the bond wires from physical damage and/or environmental effects. Solder balls 150, spheres of conductive material (e.g., tin-lead), may be attached to solder ball pads 170. Solder ball pads 170 are typically circular areas of conductive material 122 exposed by openings in the solder mask layer 132 on the bottom surface 128 of the substrate 120. When mounted to a PCB 180, the conductive material 122 forms a pathway of electrical communication between the die 110 and the PCB, as well as to the electrical device (not shown) in which the PCB is eventually installed. The package substrate 120 and PCB 180 may both be laminate electronic circuit boards with similar constructions, which will be discussed in more detail herein.

Referring now to FIG. 2A, a cross-sectional view of a solder joint 200 is shown, in which a solder ball 150 is mounted between a standard solder-mask-defined (SMD) solder ball pad 170 and a PCB 180. The standard SMD pad 170 is so named because the pad 170 is "defined" by the solder mask 132, such that only the central portion of the pad is exposed for attachment to a solder ball 150. FIG. 2B shows a perspective view of the standard SMD pad 170. The opening 210 in the solder mask 132 defines the pad area exposed for attachment to a solder ball (not shown in FIG. 2B). The insulating material 124 used in a package substrate 120 may be bismaleimide triazine (BT), with a center insulating layer, or core, of BT or another organic material, such as glass-fiber-reinforced epoxy (FR4). The conductive material 122 may be copper, which may tend to delaminate, or peel away, from the BT when subjected to temperature cycling used in semiconductor package reliability testing. Adhesion between the insulating material 124 and the solder mask 132, another non-metal, may be greater than adhesion between an organic insulating material and a metal pad 170. As such, the overhanging lip 212 of solder mask 132 covering the outer edge 172 of pad 170 may serve to hold the pad onto the insulating material 124, lessening the chance for delamination.

As the solder ball 150 does not adhere to the solder mask 132, when the solder ball is attached, a neck 230 of reduced diameter may form in the solder ball near the interface between the solder ball and pad 170. This interface may have the highest stress concentrations within the solder joint under temperature cycling, bending, vibration or drop-impact conditions. Packaged semiconductor devices often undergo board-level reliability (BLR) testing, reliability stress tests that may subject a PCB-mounted packaged semiconductor device to temperature cycling, elevated humidity and/or pressure. This analysis may give an indication on how the packaged semiconductor device will perform in the field once the package is assembled into an electronic device.

Solder joint reliability is a significant area of concern with ball grid array (BGA) packages, such as that shown in FIG. 1. BGA packages are so named due to the array of pads for mounting solder balls to on the bottom surface of the substrate. A PCB 180 and a package substrate 120 may have considerably different coefficients of thermal expansion (CTE), a value associated with the amount a material expands per degree of temperature increase. As the packaged semiconductor device 100 may collectively expand at a different rate than the PCB 180 to which it is attached, significant material stresses may occur within the solder balls 150 attaching the two. As structures tend to fail at areas of reduced diameter or along simple, planar interfaces, the neck area 230 of solder ball 150 is particularly susceptible to cracking under material stresses. Temperature cycling is a common BLR test, in which a PCB-mounted package is cycled through temperature extremes, with periods of sustained exposure (or soaks) to either of the extremes.

A typical temperature cycle test may comprise a temperature increase from room temperature (i.e., about 25 C) to 125 C, a temperature decrease to −40 C, a cold-soak, a temperature increase back up to 125 C, a hot-soak, and a temperature decrease to room temperature again. With each added material or thermal stress, the amount of plastic work density—a measure of material damage within solder ball 150—increases. The higher the plastic work density value, the higher the chance of crack propagation if a defect is present in the solder ball 150. While the standard SMD design addresses delamination concerns by pinning down the edge 172 of the pad 170, a crack may easily propagate across neck 230, possibly along linear path 232.

Referring now to FIG. 3A, a cross-sectional view of a solder joint 300 is shown, in which a solder ball 150 is mounted between a non-solder-mask-defined (NSMD) solder ball pad 270 and a PCB 180. The NSMD pad 270 is so named because the pad is not defined by an opening 310 in the solder mask 132. Instead, the opening 310 may be larger than the pad 270, such that a portion of the insulating material 124 around the pad is exposed, as shown in the perspective view of FIG. 3B. As shown in the cross-section of FIG. 3A, there is no reduced-diameter neck in a solder ball 150 attached to a NSMD pad 270. A crack originating near the interface between the ball 150 and pad 270 may have to travel a non-planar path around the pad edge 272, such as that reflected by nonlinear path 234. While it may be more difficult for the ball 150 to separate from a NSMD pad 270, the solder mask 132 does not extend over the pad 270, pinning it to the insulating layer 124. As such, the potential for delamination at the interface between the insulating material 124 and NSMD pad 270 may be greater than for the standard SMD pad 170 shown in FIGS. 2A and 2B.

An octant model, or one-eighth portion, of a semiconductor package may be used to analyze the plastic work density within a package, as packages may tend to have similar characteristic at points radially disposed from the center. Referring now to FIG. 4, an octant model 500 is shown of the plastic work density within a BGA substrate 502, shown in outline, having SMD pads (not shown). Exemplary plastic work density values 504, indicated by the relative sizes of the bubbles, are shown centered over the locations of their respective solder balls (also not shown). Plastic work density values 504 may be higher over the edge of a die 520 (shown in outline) due to material stresses that may be present in the area. It is therefore desired to devise a solder ball pad for a laminate electronic circuit board with reduced plastic work density values. It is further desired to devise a solder ball pad with the pad-adhesion benefits of a standard SMD pad and the pad geometry and associated crack-propagation protection of an NSMD pad.

BRIEF SUMMARY OF THE INVENTION

Disclosed are a raised solder-mask-defined (SMD) pad configured for receiving a solder ball on a laminate electronic circuit board, such as a semiconductor package substrate or a printed circuit board (PCB), and a method of creating the raised SMD pad. One embodiment of the method comprises defining a base bump of solder mask material by a photolithography process, and covering the base bump with a conductive bump layer of copper. The method further comprises layering a surrounding layer of solder mask material over an extended edge of the conductive bump layer. The surrounding material is patterned to expose a pad face and of a portion of the sides of the conductive bump layer, such that the pad face is disposed above the surface of the surrounding material. The surrounding material may be patterned by a photolithography process.

In another embodiment, a copper base bump is defined by depositing the copper and etching away a portion of the copper. The copper base bump is covered with a conductive bump layer also comprising copper. The method further comprises layering a surrounding layer of solder mask material over an extended edge of the conductive bump layer and defining the surrounding layer with a laser-drill process.

BRIEF DESCRIPTION OF THE DRAWINGS

For a detailed description of the preferred embodiments of the invention, reference will now be made to the accompanying drawings in which:

FIG. 1 is a cross-sectional view of a packaged semiconductor die;

FIG. 2A is a cross-sectional view of a solder joint in which a solder ball is mounted between a solder-mask-defined (SMD) solder ball pad and a printed circuit board (PCB);

FIG. 2B is a perspective of the SMD solder ball pad of FIG. 2A, without the solder ball;

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect electrical connection via other devices and connections.

The term "integrated circuit" refers to a set of electronic components and their interconnections (internal electrical circuit elements, collectively) that are patterned on the surface of a silicon, or other suitable, semiconductor substrate. The term "packaged semiconductor device" refers generically to an integrated circuit (IC) assembled into a semiconductor package. The term "die" ("dies" for plural) refers generically to an integrated circuit, in various stages of completion, including the underlying semiconductor substrate and all circuitry patterned thereon. The term "wafer" refers to a generally round, single-crystal semiconductor substrate.

The term "interconnect" refers to a physical connection providing electrical communication between the connected items. The term "packaged semiconductor device" refers to a die mounted within a package, as well as all package constituent components. The term "semiconductor package" refers generically to the components for encapsulating and interconnecting a die to a printed circuit board. To the extent that any term is not specially defined in this specification, the intent is that the term is to be given its plain and ordinary meaning.

DETAILED DESCRIPTION OF THE PREFERRED EMBODIMENTS

Figure 3B:
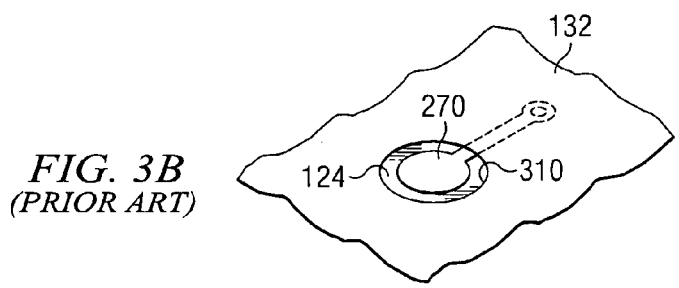
FIG. 3B is a perspective of the NSMD solder ball pad of FIG. 3A, without the solder ball.
Figure 5A:
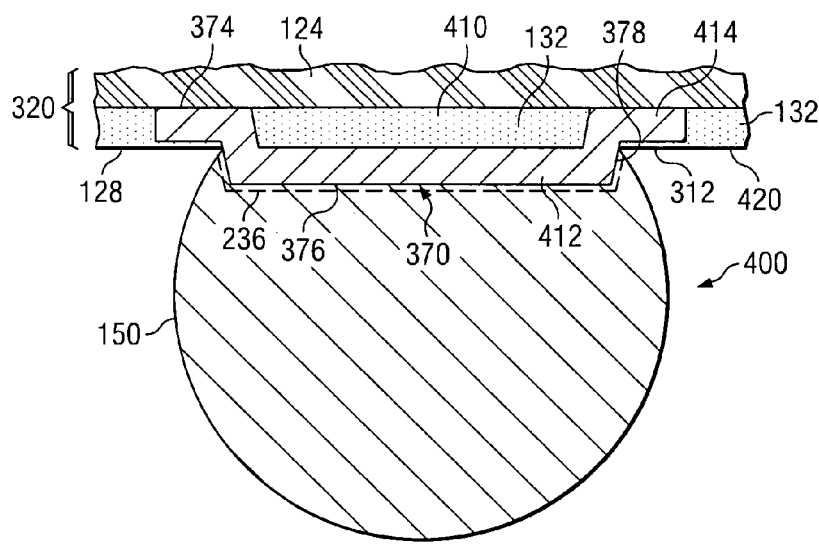
FIG. 5A is a cross-sectional view of a solder joint in which a solder ball is mounted to an embodiment of a raised solder ball pad.
Figure 3A:
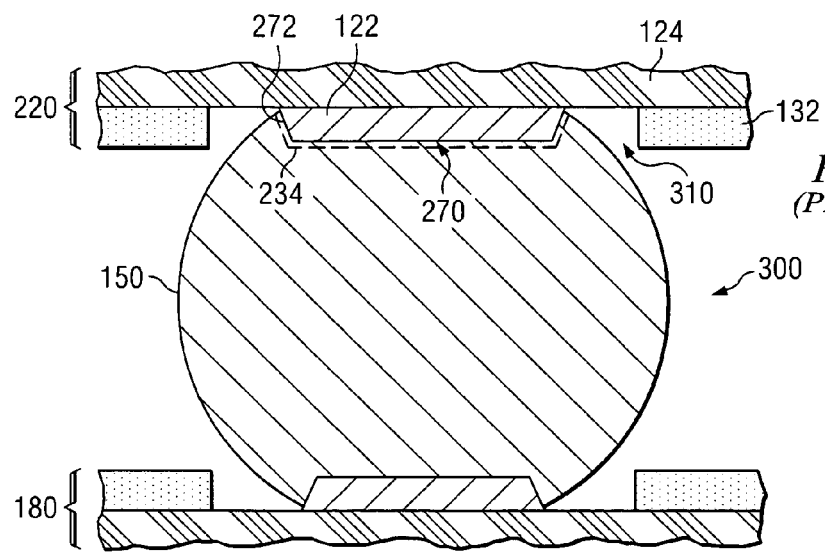
FIG. 3A is a cross-sectional view of a solder joint in which a solder ball is mounted between a non-solder-mask-defined (NSMD) solder ball pad and a PCB.

FIG. 5A shows a cross-sectional view of solder joint 400, in which a solder ball 150 is mounted to a raised solder-mask-defined (SMD) solder ball pad 370 on a laminate electronic circuit board 320. The laminate electronic circuit board 320 may be a semiconductor package substrate, a printed circuit board, or any laminate electronic circuit board. In the embodiments shown, the raised SMD pad 370 is created by first creating a base bump 410 of an organic material, preferably a solder mask material 132, on the surface of an insulating material 124. A plurality of base bumps 410 may simultaneously be formed by a photolithography patterning process. Package substrates and PCB's may have similar laminate constructions, including alternating conductive and insulating layers. The insulating layers of the laminate electronic circuit board 320 may bismaleimide triazine (BT), with a center insulating layer, or core, of BT or another organic material, such as glass-fiber-reinforced epoxy (FR4).

To pattern a base bump 410 onto the insulating material 124, the solder mask material 132 is applied, a mask (not shown) is positioned where a defined area is desired, and the solder mask is exposed to light through openings in the mask. Exposure to light may effect material changes in the solder mask, such that the portion exposed may either be cured or alternatively, softened for later removal, depending on the type of solder mask chosen. A portion of the solder mask is then removed, leaving the base bump 410.

Alternatively, the base bump 410 may be a built-up dielectric material, such as ABF marketed by Ajinomoto, Inc. In addition, the base bump may otherwise be a non-organic material, or even a conductive material or metal, such as copper. A method of creating a properly shaped copper base bump may involve applying a relatively thick layer of copper, then etching away any undesired material. Several variations in the disclosed embodiments may be possible while using existing tooling and materials.

After creating the base bump 410, a layer of conductive material 412 is applied over the base bump, preferably fully covering the base bump and forming an extended edge 414 around the perimeter of the bump. Accordingly, a raised SMD pad 370 is created with the pad-adhesion benefits of a standard SMD pad and the ball-pad interface geometry and associated crack-propagation protection of an NSMD pad.

The conductive bump layer 412 may be applied over the base bump 410 by any suitable process for adhering the conductive material to the base bump material, and may vary by the material(s) chosen. The conductive bump layer 412 is preferably copper, although any conductive material (e.g., nickel, aluminum, silver, gold) that will adhere to the underlying base bump material 410 may be used.

The conductive bump layer 412 may be created by electroplating, a process in which the laminate electronic circuit board 320 is placed in a bath and connected to electrodes (not shown), depositing metal onto the base bump 410 through an oxidation-reduction process. Alternatively, an electroless process may be used, in which a chemical bath serves to carry out a catalyst-induced chemical process for depositing the conductive bump layer 412 onto the base bump 410. Any method for covering the base bump 410 with a conductive bump layer 412 may be used, as long as the resulting conductive bump layer forms a raised pad disposed above the surface of the laminate electronic circuit board 320.

In a subsequent process, a surrounding material 420, preferably a solder mask material 132, is applied over the conductive bump layer 412. The surrounding material 420 may then be patterned by a photolithography or laser-drill process to expose the pad face 376 and at least a portion of the sides 378 of the conductive bump layer 412. The surrounding material 420 forms a lip 312 for holding the extended edge 414 of the conductive bump layer 412 onto the insulating material 124. The extended edge 414 shares a relatively small interface area with the underlying insulating material 124. As such, the conductive layer 412 is partially encapsulated and is less susceptible to stress-induced delamination.

Extending a layer of solder mask 132 over the extended edge 414 helps to pin the pad to the underlying insulating material 124, protecting the pad against delamination. Further, as the pad-insulating material interface may be a relatively weak interface within the pad structure, the reduced area of this interface, as shown in FIG. 5A, may lessen the potential for delamination of the pad 370. Additionally, the raised structure of the pad 370 allows the solder ball 150 to wrap around the outer sides of the pad. This raised structure mimics the pad geometry of a NSMD pad, eliminating the reduced-diameter neck of a standard SMD pad, and potentially strengthening the ball-to-pad interface.

The solder mask material 132 used to create the base bump 410 is preferably an organic, photo-definable solder mask, such as a photosensitive polymer PSR-4000BV manufactured by Taiyo America, Inc. However, the base bump 410 could alternatively be any organic material. Organic materials may tend to be relatively low-modulus materials, or materials which are less rigid and may stretch more without permanent deformation when a force is applied. Organic materials may have similar material properties to those of the insulating material 124, such as modulus of elasticity and coefficient of thermal expansion (CTE). Placing a material with similar properties adjacent to the insulating material 124 may reduce material stresses locally as well as throughout the laminate electronic circuit board.

The pad face 376 to which a solder ball 150 may be attached is raised above the surface 128 of the substrate 320. As such, the material of the solder ball 150 may wrap around the outer sides 378 of the pad. Accordingly, a solder ball 150 used in conjunction with the raised SMD pad 370 would benefit from the non-planar crack propagation path 236 while still maintaining a reduced risk of delamination. These benefits may be due to both the reduced pad base area 374 and the overlapping solder mask 312 of an SMD design.

Figure 5B:
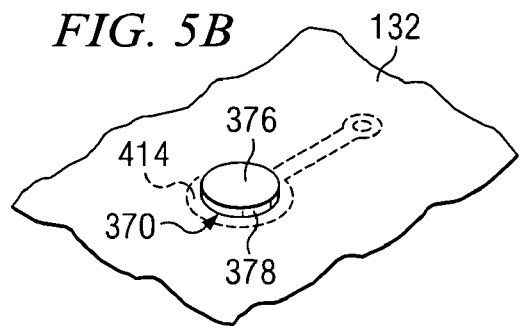
FIG. 5B is a perspective of the raised solder ball pad of FIG. 5A, without the solder ball.

The raised SMD pad 370 of FIGS. 5A and 5B is shown as having a relatively planar pad face 376 and sharp delineation between the face and sides 378 of the raised SMD pad. However, a raised SMD pad, in accordance with at least some embodiments, may have a more rounded shape, such that the sides 378 merge into the pad face 376. In such a case, the pad face 376 may be interpreted as the exposed area of the conductive bump layer 412 visible in a top view. Correspondingly, the sides 378 of the raised SMD pad 370 may be interpreted as the exposed area of the conductive bump layer 412 visible in a side view.

Figure 5C:
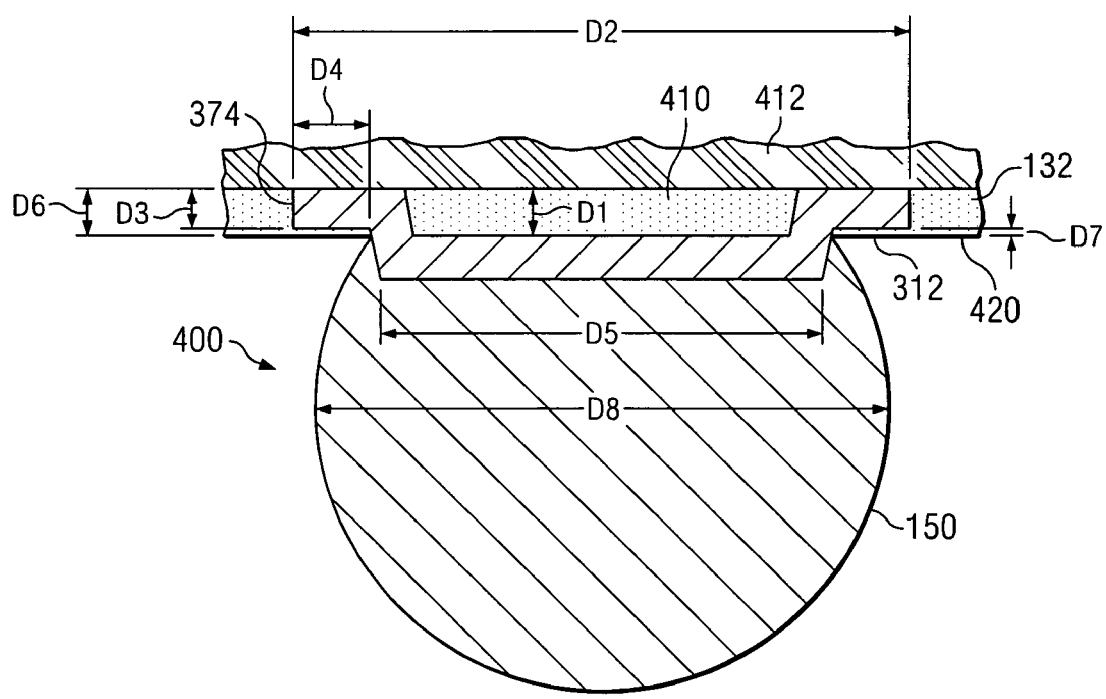
FIG. 5C is a dimensioned, cross-sectional view of the solder joint of FIG. 5A.

Referring now to FIG. 5C, an exemplary solder joint 400 may comprise a base bump 410 having a thickness D1 of less than 30 microns (μm), wherein 1 μm is equal to one one-thousandth of a millimeter. The conductive bump layer 412 may have a width D2 of about 380 μm and a thickness D3 of about 25 μm. As viewed from above, the extended edge 374 of the conductive bump layer 412 may have a width D4 of about 50 μm, and the raised pad face may have a width D5 less than 280 μm. The surrounding layer 420 of solder mask material 132 may have a total thickness D6 of about 30 μm, with a lip 312 having a thickness D7 of about 5 μm continuing over the extended edge 374. Further, the exemplary solder ball 150 may have a diameter D8 of about 350 μm.

As previously discussed, relatively high material stresses may occur in areas in which materials with significantly different material properties are present, potentially resulting in higher local plastic work density values. A silicon die tends to be less expansive when subjected to temperature increases and far more brittle that surrounding packaging materials. High plastic work density values may result in failure of the solder ball at the affected location, and ultimately, of lost electrical communication at this location between a package substrate and the PCB.

Figure 6:
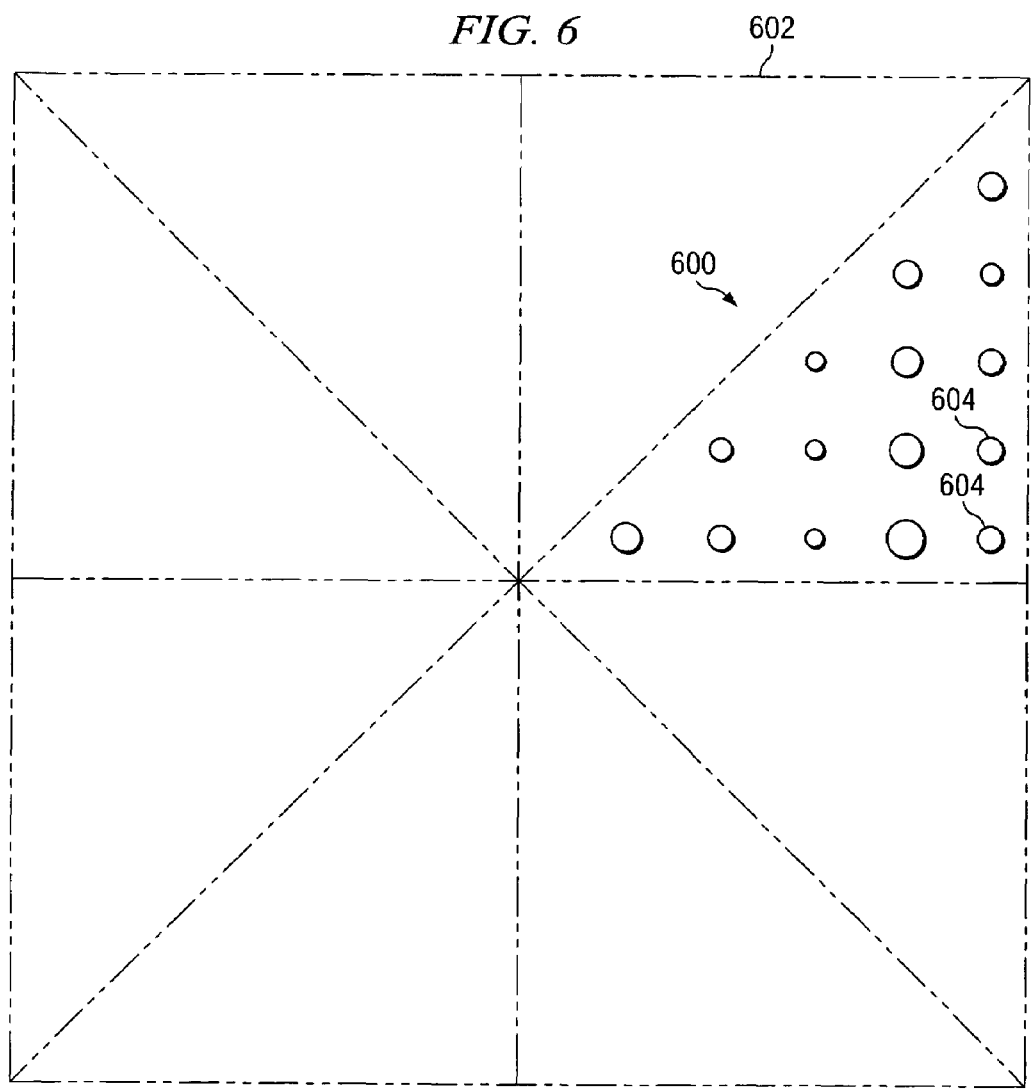
FIG. 6 is an octant model of the plastic work density within an embodiment of a BGA substrate having raised SMD pads.

FIG. 6 shows an octant model 600 of the plastic work density within a BGA package substrate 602, shown in outline, having raised solder ball pads (not shown) in accordance with an embodiment of the present invention. The package represented in FIG. 6 is understood to be otherwise identical to the package represented by FIG. 4, except for the solder ball pad designs. It is assumed that both package substrates have been exposed to equivalent levels of stressing. Exemplary plastic work density values 604 for this raised-pad substrate 602 are clearly smaller than for the standard SMD-pad substrate 502 shown in FIG. 4.

Figure 4:
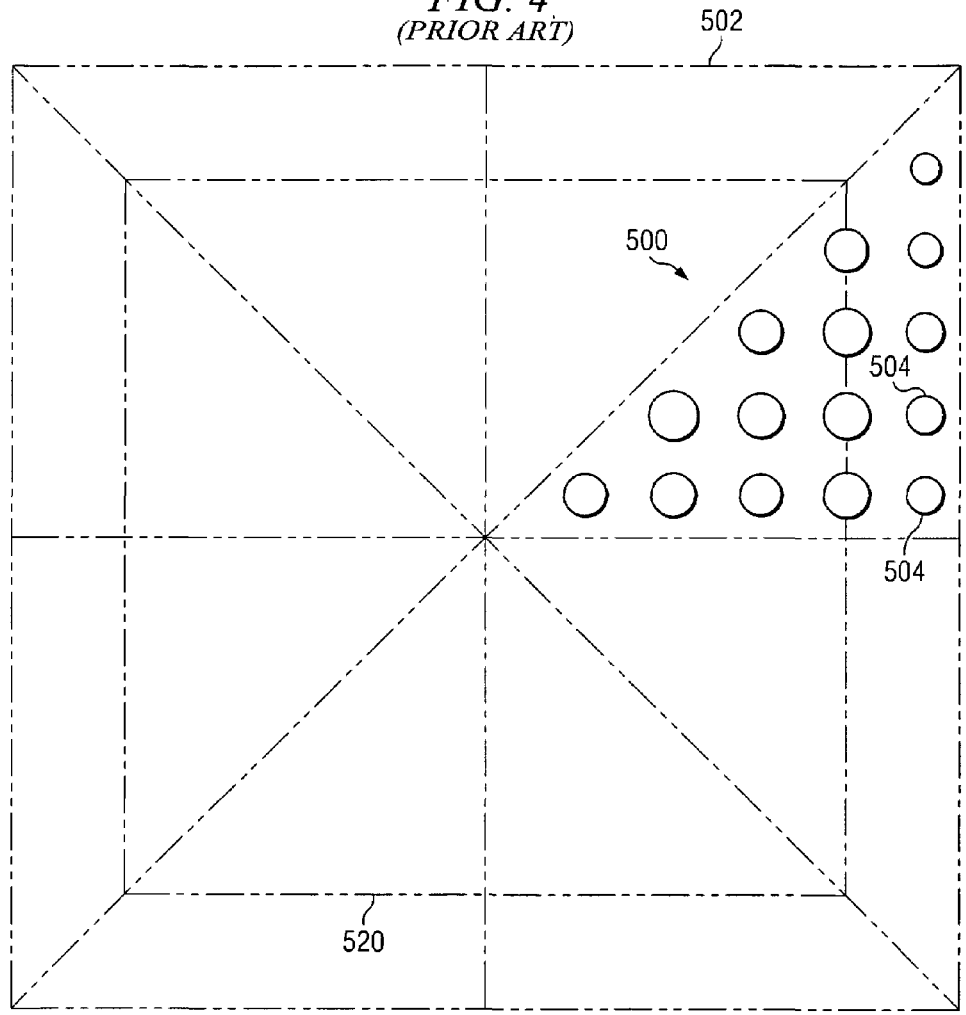
FIG. 4 is an octant model of the plastic work density within a BGA substrate having SMD pads
Figure 7:
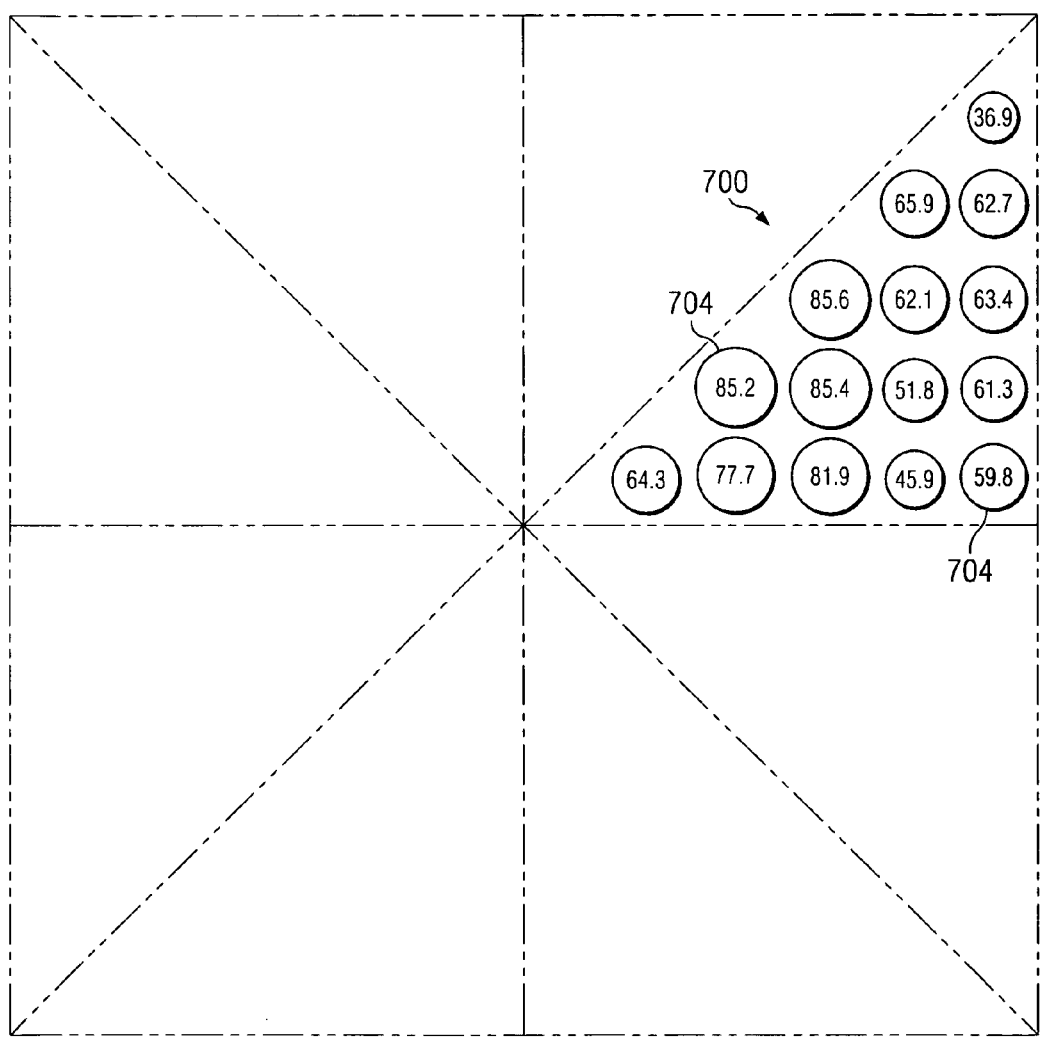
FIG. 7 is an octant model showing the percent difference in plastic work density values between FIGS. 4 and 6.

FIG. 7 shows an octant model 700 showing the percent differences 704 in plastic work density values between the standard SMD pads of FIG. 4 and the raised SMD pads of FIG. 6. In the example shown, the plastic work density reductions with the raised SMD pads in accordance with the preferred embodiment range from 36.9 percent to 85.6 percent. Reduced plastic work density values may translate into longer fatigue life for the solder joints represented. The plastic work density difference may be even greater for substrates subjected to further stressing, as plastic work density damage may be cumulative over the life of a solder ball.

Board-level reliability (BLR) testing is a general simulation of the stresses a packaged semiconductor device is subjected to in the field. During normal operation, a packaged semiconductor device may undergo exposure to temperature extremes and varied environmental conditions. Accordingly, it is preferable to lower the plastic work density incurred within a the solder balls of a package substrate, and also lower the rate at which plastic work density increases as the package is subjected to further stressing.

Figure 8:
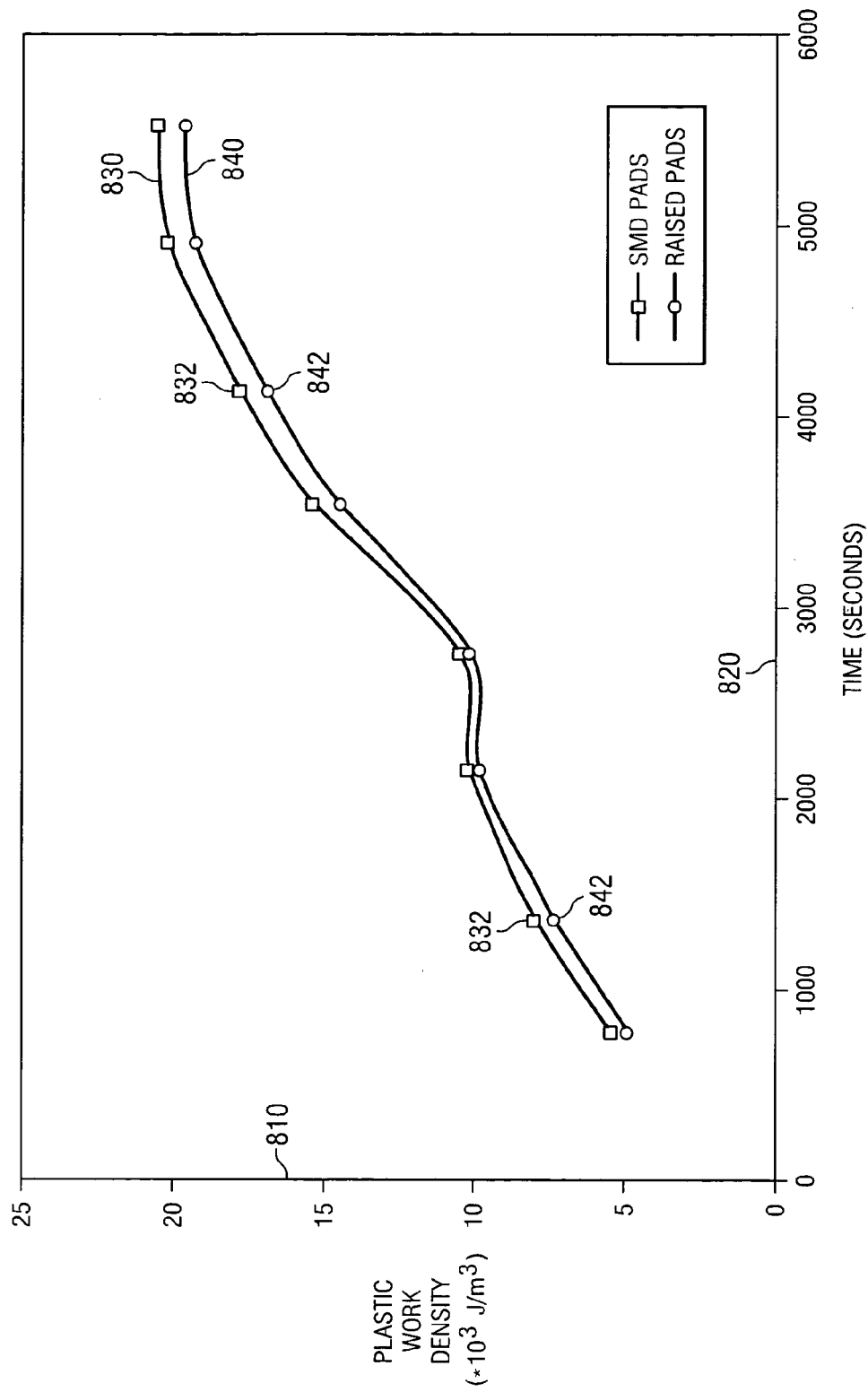
FIG. 8 is a graph of plastic work density as a function of time for a solder ball mounted on an SMD pad versus a solder ball mounted on an embodiment of a raised SMD pad.
Figure 5B:
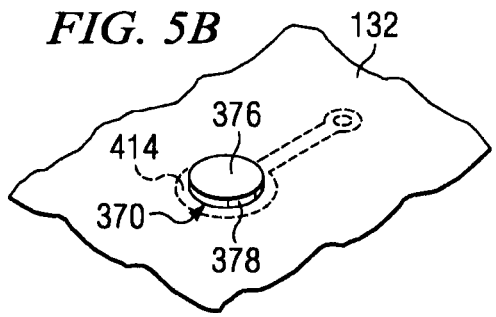
Figure 5C:
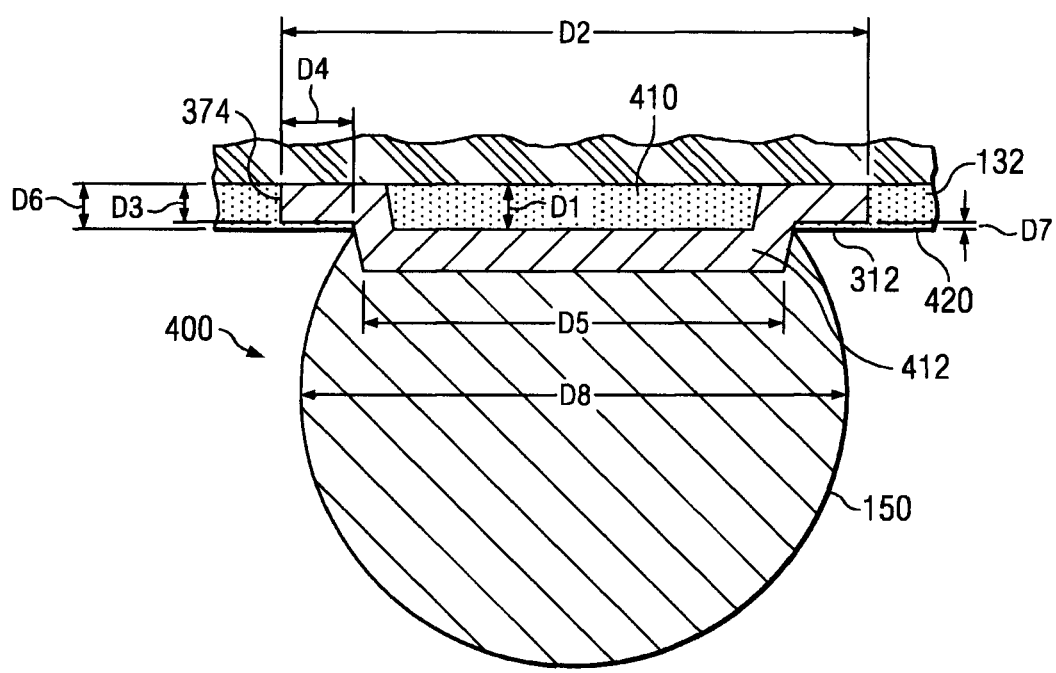

Referring now to FIG. 8, a graph 800 is shown of plastic work density 810 as a function of time 820 for a solder ball mounted on an SMD pad versus a solder ball mounted on a raised SMD pad. The graph 800 is of a single solder-ball location on separate substrates subjected to the same temperature cycling process. In the example shown, the SMD-pad plastic work density values 832 are consistently higher than the raised-pad plastic work density values 842. Further, as time 820 progresses, it is apparent that the difference between plastic work density values 832 and 842 continues to increase, as evidenced by the growing distance between the two sets of values. Further plastic work density reduction benefits may be seen if the package substrate and the PCB to which the package substrate is mounted both incorporate the raised SMD pads of the embodiments.

The above discussion is meant to be illustrative of the principles and various embodiments of the present invention. Numerous variations and modifications will become apparent to those skilled in the art once the above disclosure is fully appreciated. For example, a package substrate in accordance with the embodiments may be a wirebonded substrate, a flip-chip substrate and may have any number of laminate constructions. Further, a laminate electronic circuit board having raised SMD pads in accordance with the embodiments may be a package substrate, a motherboard, a daughterboard or other electronic circuit board utilizing solder ball pads. It is intended that the following claims be interpreted to embrace all such variations and modifications.

What is claimed is:

1. A method for creating a raised SMD pad comprises the steps of:
   providing a pad face disposed above a surface of a laminate electronic circuit board
   forming a base bump on the laminated electronic circuit board;
   covering the base bump with a conductive bump layer, wherein the conductive bump layer covers the base bump and forms an extended edge around a perimeter of the base bump; and
   layering a surrounding material over the extended edge of the conductive bump layer.

2. A method according to claim 1, wherein forming the base bump further comprises creating an area of a conductive metal.

3. A method according to claim 1, wherein forming the base bump further comprises exposing an area of an organic material.

4. A method according to claim 3, wherein exposing the area of the organic material further comprises exposing an area of a material selected from a group comprising a solder mask material or a built-up dielectric material.

5. A method according to claim 3, wherein exposing the area of the organic material comprises:
   dispensing the organic material over an insulating layer on the surface of the substrate; and
   removing a portion of the organic material.

6. A method according to claim 1, wherein covering the base bump with a conductive bump layer further comprises covering the base bump with a material selected from a group consisting of copper, aluminum, gold, silver and nickel.

7. A method according to claim 1, wherein layering the surrounding material over the extended edge of the conductive bump layer further comprises the steps of:
   applying the surrounding material over the conductive bump layer; and
   removing a portion of the surrounding material to expose the pad face and at least a portion of the sides of the conductive bump layer.

8. A method according to claim 7, wherein applying the surrounding material over the conductive bump layer further comprises applying a solder mask material over the conductive bump layer.

9. A method according to claim 7, wherein removing a portion of the surrounding material further comprises subjecting the surrounding material to a photolithography process.

10. A method according to claim 7, wherein removing a portion of the surrounding material comprises subjecting the surrounding material to a laser-drill process.

* * * * *

UNITED STATES PATENT AND TRADEMARK OFFICE
CERTIFICATE OF CORRECTION

PATENT NO. : 7,294,451 B2
APPLICATION NO. : 10/715641
DATED : November 13, 2007
INVENTOR(S) : Tz-Cheng Chiu et al.

It is certified that error appears in the above-identified patent and that said Letters Patent is hereby corrected as shown below:

Delete Drawing Sheet 4 and substitute therefor the Drawing Sheet consisting of Figs 5B and 5C as shown on the attached page.

Signed and Sealed this

Sixth Day of April, 2010

David J. Kappos
*Director of the United States Patent and Trademark Office*